United States Patent
Iroaga et al.

(10) Patent No.: US 12,045,072 B2
(45) Date of Patent: Jul. 23, 2024

(54) SYSTEM AND METHOD FOR CALIBRATION OF MULTI-CHANNEL TRANSCEIVERS

(71) Applicant: MACOM Technology Solutions Holdings, Inc., Lowell, MA (US)

(72) Inventors: Echere Iroaga, Mountain View, CA (US); Amaaduddin Zoab Quraishi, Milpitas, CA (US); Naga Rajesh Doppalapudi, Santa Clara, CA (US); Jian Wang, Morganville, NJ (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 17/004,997

(22) Filed: Aug. 27, 2020

(65) Prior Publication Data

US 2022/0066489 A1    Mar. 3, 2022

(51) Int. Cl.
| | |
|---|---|
| G05F 1/10 | (2006.01) |
| G05F 1/575 | (2006.01) |
| G05F 3/02 | (2006.01) |
| H03K 5/24 | (2006.01) |
| H03M 1/12 | (2006.01) |

(52) U.S. Cl.
CPC ............... *G05F 1/575* (2013.01); *H03K 5/24* (2013.01); *H03M 1/12* (2013.01)

(58) Field of Classification Search
CPC . G05F 3/262; G05F 3/265; G05F 3/30; G05F 3/205; G11C 5/147
USPC .................................................. 327/530–543
See application file for complete search history.

(56) References Cited

U.S. PATENT DOCUMENTS

| | | | | |
|---|---|---|---|---|
| 4,813,041 | A * | 3/1989 | Reyneri | G08C 15/06 327/416 |
| 7,358,760 | B1 * | 4/2008 | Nancekievill | H03K 17/005 326/38 |
| 2004/0124903 | A1 * | 7/2004 | Chaudhari | G01R 31/31705 327/407 |
| 2007/0200619 | A1 * | 8/2007 | Jang | H03F 3/45475 330/2 |
| 2008/0186053 | A1 * | 8/2008 | Malekkhosravi | H03K 19/17744 326/38 |
| 2009/0284246 | A1 * | 11/2009 | Dash | G01R 31/40 324/76.11 |
| 2010/0225295 | A1 * | 9/2010 | Kranz | G05F 1/59 323/311 |

(Continued)

*Primary Examiner* — Quan Tra

(57) ABSTRACT

A system for calibration of a multi-channel transceiver includes a plurality of voltage regulator circuits, wherein each circuit is configured to produce a voltage for circuitry of one channel of a multi-channel transceiver. The system also includes an analog multiplexer circuit configured to selectively route the output of one of the plurality of voltage regulator circuits to a single comparison circuit. The single comparison circuit is configured to compare an output of one of the plurality of voltage regulator circuits to a target reference voltage and produce an error signal representing a difference between the output of one of the plurality of voltage regulators and the target reference voltage. The system further includes a processor configured to accept the error signal and produce a feedback signal for the one of the plurality of voltage regulator circuits. The feedback signal is operable to adjust the voltage to minimize the difference.

16 Claims, 4 Drawing Sheets

(56) References Cited

U.S. PATENT DOCUMENTS

| | | | |
|---|---|---|---|
| 2016/0126970 A1* | 5/2016 | Xu | H03M 1/36 341/118 |
| 2016/0180773 A1* | 6/2016 | Lim | G09G 3/3233 345/212 |
| 2017/0255214 A1* | 9/2017 | Ho | H02M 3/158 |
| 2019/0311773 A1* | 10/2019 | Jimenez-Olivares | G11C 29/021 |

* cited by examiner

SYSTEM AND METHOD FOR CALIBRATION OF MULTI-CHANNEL TRANSCEIVERS

FIELD OF INVENTION

Embodiments in accordance with the present invention relate to the field of integrated circuit design. More specifically, embodiments of the present invention relate to systems and methods for calibration of multi-channel transceivers.

BACKGROUND

A typical electronic system, for example, a communications transceiver, may comprise a variety of analog circuits, including, for example, voltage references, voltage to current converters, analog to digital converters, digital to analog converters, phase locked loops, analog delay blocks, and the like. Such components are sensitive to many factors, including, for example, physical layout, integrated circuit manufacturing process variations, intra- and inter-die variability, as well as operating temperature and voltage variations.

Unfortunately, such variations may lead to deleterious impacts to system performance. In addition, variations within an integrated circuit may cause differences in behavior of otherwise similar circuitry, leading to undesirable variations in performance among such similar circuits. For example, substantially similar circuits in different physical locations may behave differently. Deep sub-micron technologies may further exacerbate such variations, leading to further mismatches and overall system degradation.

Conventional solutions to these problems include designing circuits with excessive margins to maintain performance under all operating conditions. Such conventional solutions impose significant penalties on power, speed, and performance of a system. For example, designs with high margins may consume more power, and generate more waste heat than desired. The design effort required to pre-evaluate and extract integrated circuit physical layouts, estimate an impact and correct for such impacts in the design phase adds significant and undesirable increases to design effort, design time, and cost of development.

SUMMARY OF THE INVENTION

Therefore, what is needed are systems and methods for calibration of multi-channel transceivers. What is additionally needed are systems and methods for calibration of multi-channel transceivers that utilize a single comparison circuit to measure a plurality of nodes across an integrated circuit. Further, systems and methods for calibration of multi-channel transceivers are needed that improve performance of a system. There is a still further need for systems and methods for calibration of multi-channel transceivers that are compatible and complementary with existing systems and methods of design, test, manufacture, and operation of integrated circuits for use in communication transceivers.

In accordance with an embodiment of the present invention, a system for calibration of a multi-channel transceiver includes a plurality of voltage regulator circuits, wherein each circuit is configured to produce a voltage for circuitry of one channel of a multi-channel transceiver. The system also includes an analog multiplexer circuit configured to selectively route the output of one of the plurality of voltage regulator circuits to a single comparison circuit. The single comparison circuit is configured to compare an output of one of the plurality of voltage regulator circuits to a target reference voltage and produce an error signal representing a difference between the output of one of the plurality of voltage regulators and the target reference voltage. The system further includes a processor configured to accept the error signal and produce a feedback signal for the one of the plurality of voltage regulator circuits. The feedback signal is operable to adjust the voltage to minimize the difference.

In accordance with a method embodiment of the present invention, a method includes identifying a target node from among a plurality of nodes within an integrated circuit and configuring an analog multiplexer to couple the target node to a single comparison circuit. In addition, the method includes digitizing an analog value of the target node and setting a target value for the target node. Further, the method includes comparing, in a digital domain, the digitized analog value of the target node to the target value and generating a feedback signal to adjust the analog value of the target node toward the target value for the target node.

In a further embodiment of the present invention, a system includes a first functional block. The first functional block includes a first plurality of analog circuits and a first multiplexer having inputs coupled to a first plurality of nodes of the first plurality of analog circuits. The second function block includes a second plurality of analog circuits and a second multiplexer having inputs coupled to a second plurality of nodes of the second plurality of analog circuits. The first multiplexer of the first functional block and the second analog multiplexer of the second functional block are configured in a cascade arrangement to send an analog value input of the first multiplexer to an input of the second multiplexer. A single measurement circuit is configured to digitize a selected one target node value of the first and second plurality of nodes. Digital circuitry is configured to compare a digitized value of the analog value of one of the plurality of nodes to a target value for the one of the plurality of nodes. The digital circuitry is further configured to generate a feedback signal to control the selected one analog value toward the target value.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings may not be drawn to scale.

DETAILED DESCRIPTION

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Some portions of the detailed descriptions that follow are presented in terms of procedures, logic blocks, processing, and other symbolic representations of operations performed by electronic devices and/or circuits. These descriptions and representations are the means used by those skilled in the electronic arts to most effectively convey the substance of their work to others skilled in the art. In the present application, a procedure, a method, logic block, process, or the like, is conceived to be a self-consistent sequence of operations or instructions leading to a desired result. The operations are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "calibrating," "modifying," "equalizing," "adjusting," "setting," "skewing," "identifying," "establishing," "selecting," "setting," "comparing," "configuring," "generating," or the like, refer to actions and processes (e.g., method 300 of FIG. 3) of electronic devices and/or electronic circuits, including, for example, integrated circuits.

System and Method for Calibration of Multi-Channel Transceivers

Figure 1:
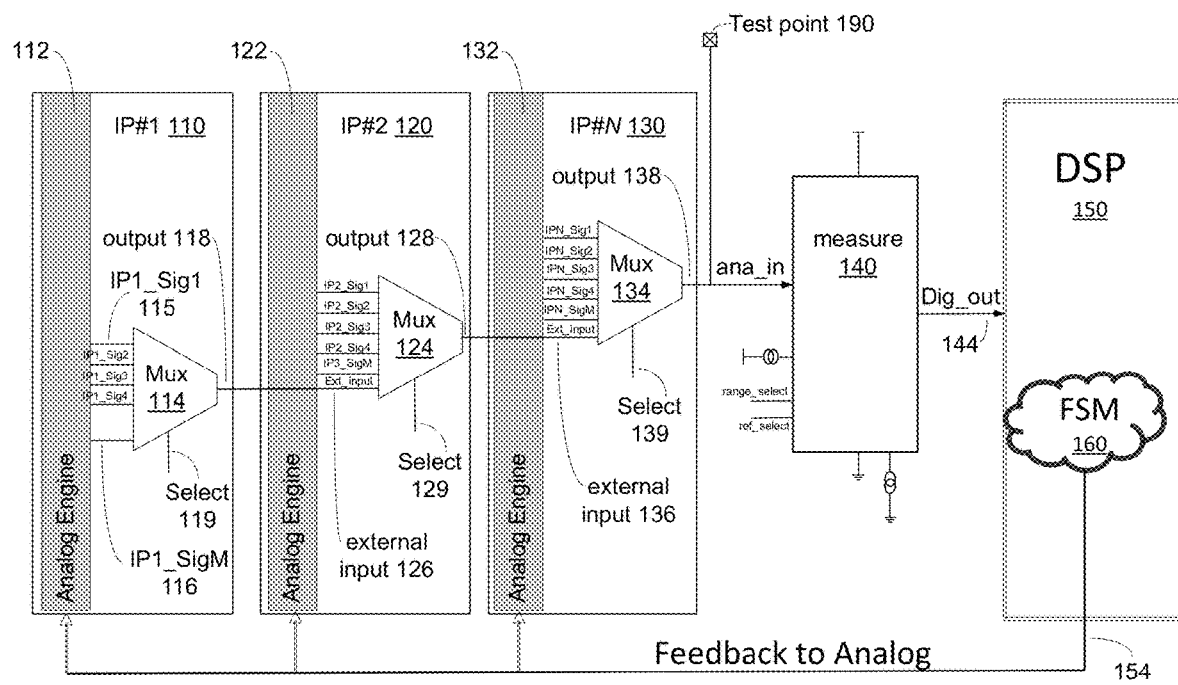
FIG. 1 illustrates an exemplary block diagram of a system for calibration of multi-channel transceivers, in accordance with embodiments of the present invention.

FIG. 1 illustrates an exemplary block diagram of a system 100 for calibration of multi-channel transceivers, in accordance with embodiments of the present invention. System 100 comprises a plurality of functional blocks IP #1 110, IP #2 120 through IP #N 130. Each functional block IP #1 110 through IP #N 130 may comprise, for example, a transceiver channel, e.g., a PAM-4 (Pulse Amplitude Modulation with 4 levels) optical receiver and/or transmitter channel, of a multi-channel transceiver. In some embodiments, the functional blocks may be substantially similar. Each functional block IP #1 110 through IP #N 130 comprises analog functions, for example, analog engine 112 of IP #1 110, analog engine 122 of IP #2 120, and analog engine 132 of IP #N 130. Exemplary analog functions may include, for example, bias current generators, voltage references, drivers, phase locked loops, analog to digital converters, and the like.

Modern high performance systems, e.g., high performance transceivers, frequently utilize a separate regulator for each clock distribution tree, phase locked loop, and/or for high performance analog signals. Such regulators provide beneficial isolation from power supply variations, and subsequently enable higher performance. The analog engines 112-132 may include regulators for such purposes. However, such performance may come at a deleterious cost of increased power consumption, e.g., due in part to the power overhead of such regulators.

In accordance with embodiments of the present invention, each functional block IP #1 110 through IP #N 130 comprises an analog multiplexer, multiplexer 114 through multiplexer 134. Each of multiplexer 114 through multiplexer 134 is configured to receive a plurality of analog signals, e.g., IP1_Sig1 115 through IP1_SigM 116. In some embodiments, each of multiplexer 114 through multiplexer 134 comprises a plurality of analog switches corresponding to each channel of an exemplary multi-channel transceiver.

Exemplary analog signals may comprise or correspond to voltages, currents, clock phases, temperature, and/or process parameters in some embodiments. In general, the analog signals IP1_Sig1 115 through IP1_SigM 116 may be signals useful to calibrate, modify, equalize, adjust, set, and/or skew analog circuitry, e.g., analog circuits within analog engine 112. However, this is not required. In some embodiments, signals input to the plurality of multiplexers 114-134 may have other uses, for example, as performance monitors, including recording data over time.

Each multiplexer 114-124 is configured to select a single output from among a plurality of input signals, responsive to a select signal. For example, multiplexer 114 produces output 118 as one of the input signals to multiplexer 124, e.g., IP1_Sig1 115 through IP1_SigM 116, responsive to select signal 119. Select signal 119 may comprise a plurality of binary signals in some embodiments. In some embodiments, select signal may comprise a multi-level, e.g., more than 2 levels, signal.

Each functional block IP #1 110 through IP #N 130 comprises an analog multiplexer that is similarly configured. For example, select signal 129 selects from among the inputs to multiplexer 124 to produce an output 128, and select signal 139 selects from among the inputs to multiplexer 134 to produce an output 138.

In accordance with embodiments of the present invention, at least one input of multiplexer 134 is coupled to the output of the multiplexer 124, e.g., a prior stage. For example, external input 136, an input to multiplexer 134, is coupled to output 128 of multiplexer 124. In some embodiments, external input 136 may be directly connected to output 128. Similarly, at least one input of multiplexer 124 is coupled to the output of the multiplexer 114. For example, external input 126, an input to multiplexer 124, is coupled to output 118 of multiplexer 114. This novel cascade arrangement of multiplexers, e.g., multiplexer 114 through multiplexer 134, enables test and calibration circuitry, for example, measurement unit 140, further described below, to access any input to any of the plurality of multiplexers.

Output signal 138 from multiplexer 134 is input into measurement unit 140, and converted into a digital signal 144. Digital signal 144 is input into digital signal processor 150. In some embodiments, digital signal processor 150 may execute a program or other software, to process digital signal 144. In some embodiments, digital signal processor 150 may comprise a finite state machine 160, configured to process digital signal 144. In some embodiments, finite state machine 160 may operate independently of software. Finite state machine 160 may comprise memory locations, e.g., registers, to store variable values, for example, to store target voltage values. The location of finite state machine 160, illustrated as being within digital signal processor 150 is exemplary, and is not required. Finite state machine 160 and/or digital signal processor 150 operates on digital signal 144 to produce feedback signal 154.

In some embodiments, finite state machine 160 may be dedicated to processing digital signal 144 to produce feedback signal 154. For example, finite state machine 160 does not perform any other function. By utilizing a dedicated finite state machine, e.g., an embodiment of finite state machine 160, a finite state machine may operate at very high speed, providing feedback to a plurality of analog circuits. Such digital-based feedback may operate in conjunction with, and/or replace, analog feedback, in some embodiments. In some embodiments, a digital feedback loop comprising a dedicated finite state machine may comprise sufficient bandwidth to reduce and/or eliminate an analog feedback loop conventionally utilized in many analog circuits, e.g., amplifiers as utilized in voltage regulators. In some embodiments, a digital feedback loop comprising a dedicated finite state machine may increase a bandwidth of an analog circuit compared to a comparable circuit based only on analog feedback. In some embodiments, a digital feedback loop comprising a dedicated finite state machine may increase a gain of an analog circuit compared to a comparable circuit based only on analog feedback. In some embodiments, a digital feedback loop comprising a dedicated finite state machine may decrease power consumption of an analog circuit compared to a comparable circuit based only on analog feedback.

Output signal 138 may optionally be conveyed to test point 190, which may be an integrated circuit test point, e.g., an integrated circuit pad and/or an external package pin. Test point 190 may be used as an input or an output, for example, to calibrate measurement unit 140, in some embodiments.

Feedback signal 154 may be analog or digital in nature. For example, feedback signal may be produced by a digital to analog converter, which may be internal or external to digital signal processor 150. Feedback signal 154 is provided to one or more analog functions, for example, analog engine 112 of IP #1 110. Within the one or more analog engines, feedback signal 154 is used to control and/or adjust an analog parameter, e.g., a voltage, utilized by the analog engine(s). In this novel manner, a plurality of analog signals or node values from any of a plurality of functional blocks may be measured by a single measurement unit, and processed by a single processing unit, in order to provide a feedback signal to calibrate, modify, equalize, adjust, set, and/or skew an analog function of a functional block, in order to improve performance, which may include desirably decreasing power consumption, of the analog block and/or system as a whole.

Figure 2:
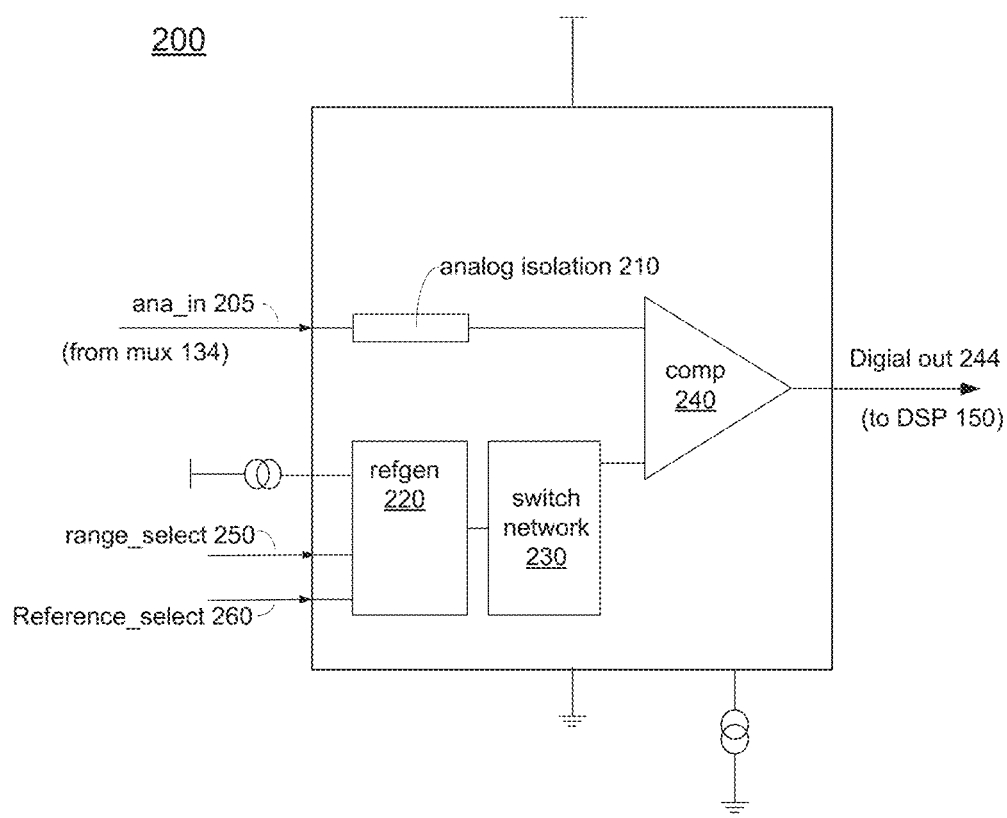
FIG. 2 illustrates an exemplary block diagram of a measurement system for calibration of multi-channel transceivers, in accordance with embodiments of the present invention.

FIG. 2 illustrates an exemplary block diagram of a measurement system 200 for calibration of multi-channel transceivers, in accordance with embodiments of the present invention. Measurement system 200 may correspond to measurement unit 140 of FIG. 1, in some embodiments.

Measurement system 200 functions as an analog to digital converter. Reference generator 220 and switch network 230 are controlled by range select 250 and reference select 260 to produce a selected voltage as one input to comparator 240. Range select 250 and/or reference select 260 may be controlled internally to measurement system 200 in some embodiments. In some embodiments, range select 250 and/or reference select 260 may be controlled externally to measurement system 200, for example, by digital signal processor 150 of FIG. 1. Analog input 205, e.g., output 138 from multiplexer 134 of FIG. 1, is isolated by analog isolation 210, and used as the other input to comparator 240. The output of comparator 240, digital out 244, is provided to digital signal processor 150 (FIG. 1).

Referring once again to FIG. 1, digital signal processor 150 and/or finite state machine 160 implement(s) a process to calibrate, modify, equalize, adjust, set, and/or skew an analog function within the plurality of functional blocks IP #1 110 through IP #N 130 during operation of an integrated circuit, for example, after manufacture of the integrated circuit, in accordance with embodiments of the present invention.

Figure 3:
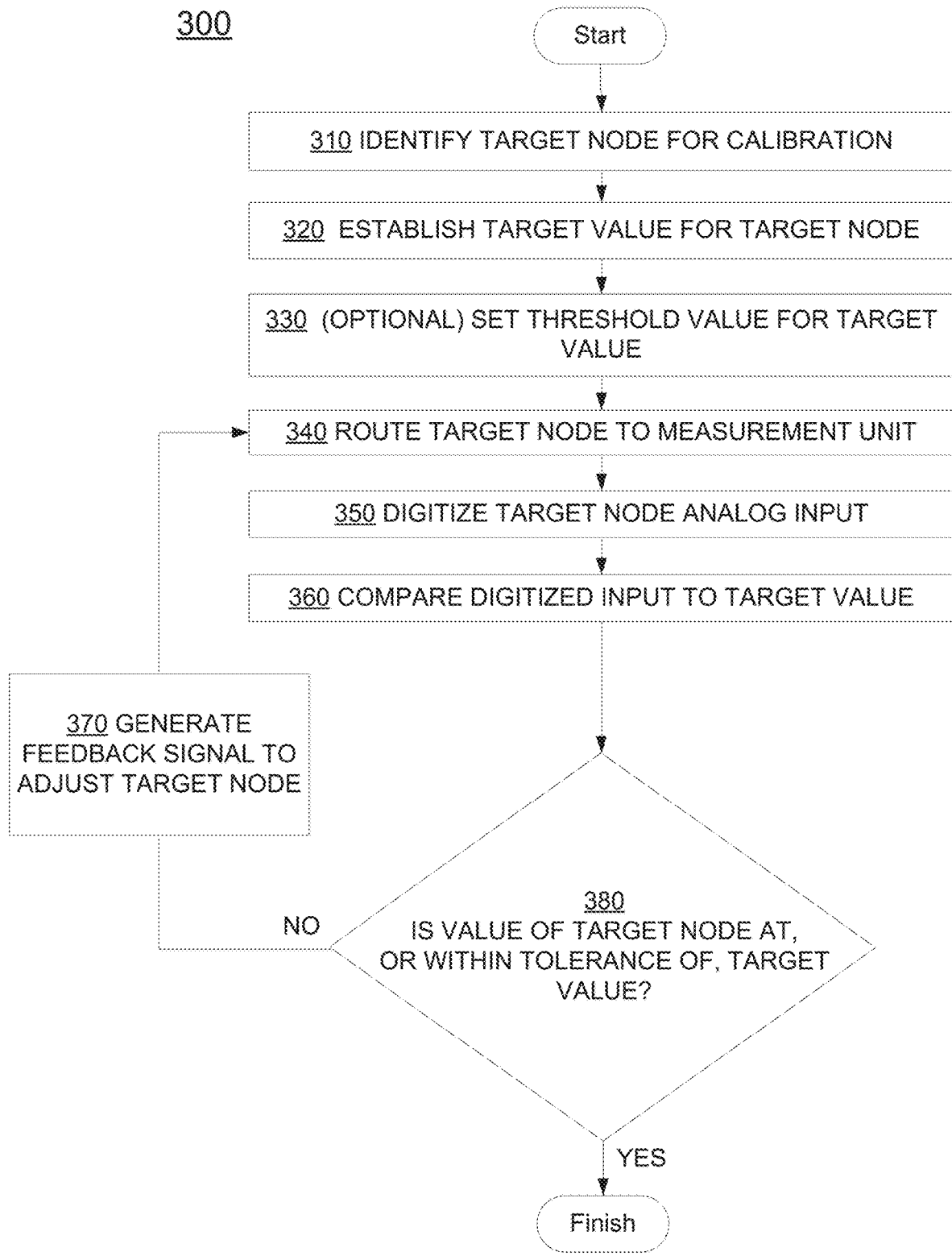
FIG. 3 illustrates an exemplary method of calibrating an analog function within a plurality of functional blocks, in accordance with embodiments of the present invention.

FIG. 3 illustrates an exemplary method 300 of calibrating an analog function within a plurality of functional blocks, in accordance with embodiments of the present invention. In 310, a target node is identified for calibration. The target node may be any suitable node of analog circuitry within system 100 (FIG. 1). The target node is coupled to a multiplexer, e.g., multiplexer 114 (FIG. 1), within the target node's functional block. For example, for a target node in analog engine 112, a target node may be coupled to multiplexer 114 (FIG. 1). In 320, a target value is established for the target node. The target value may be a voltage value, in some embodiments. The target value may be unique to the target node, e.g., no other target node has the same target value, in some embodiments. The target value may be predetermined and/or derived from another on-chip measurement, in some embodiments. In optional 330, a threshold value is set for the target value. A threshold value may be an acceptable variance of the target value. In some embodiments, the threshold value may vary according to the target node.

In 340, the target node is routed or coupled to the input of a measurement unit, e.g., measurement unit 140 (FIG. 1). For example, the multiplexer select signals 119 through 139 are configured to route the target node signal to the input of the measurement unit 140 (FIG. 1). For example, the signal IP1_Sig1 115 from analog engine 112, corresponding to a target node within analog engine 112, may be routed through multiplexer 114 to the external input 126 of multiplexer 124, and from the output 128 of multiplexer 124 to the external input 136 of multiplexer 134, and from output 138 of multiplexer 134 to measurement unit 140 (FIG. 1).

In 350, the analog input to measurement unit 140 is digitized, and presented to a digital signal processor, e.g., digital signal processor 150 of FIG. 1. In 360, the digitized value of the target node is compared to the target value for the target node. In 380, if the analog value of the target node has not reached the target value, or, optionally, if the analog value of the target node is not within the threshold value of the target value, control passes to 370. Otherwise, the process 300 completes. In 370, the digital signal processor 150 and/or finite state machine 160 (FIG. 1) generates a feedback signal, e.g., feedback signal 154, to adjust the analog value of the target node. Generating operation 370 may comprise generating an error signal, e.g., a different between a measured value and a target value. In some embodiments, the error signal may be a digital signal. The feedback signal is communicated to circuitry (not shown) that generates or controls the analog value of the target node.

In some embodiments, process 300 may operate to equalize voltages throughout, e.g., an analog circuit chain. For example, all voltage regulators in a circuit may be set to the same voltage. In some embodiments, process 300 may operate to establish varying voltages among similar or corresponding analog circuits. For example, some voltage regulators in a circuit may be calibrated to have an offset voltage, in comparison to another voltage regulator in the same circuit. The novel use of a target value for each node enables great flexibility in calibration of such nodes, in accordance with embodiments of the present invention.

Process 300 may operate on a single target node, or may sequence through any number of nodes. Process 300 may operate substantially continuously, e.g., beginning again immediately after completion, periodically, e.g., on a schedule, for example, based on a real time clock or based on a system clock signal, or may operate in response to events, including system internal events and/or events external to a system, in any combination. For example, process 300 may operate in response to power events, including power on events, in response to every nth packet received, and/or the like. Beneficially, process 300 does not require a special test mode. Process 300 may operate while the integrated circuit is performing its main function. For example, process 300 may operate while an exemplary optical transceiver is receiving a data signal.

In accordance with embodiments of the present invention, one or more signals input into the plurality of multiplexers 114 to 134 may have known values. By using known values, any effect of the plurality of multiplexers 114 to 134 may be directly observed, and such net effect may be accounted for by process 300.

Figure 4:
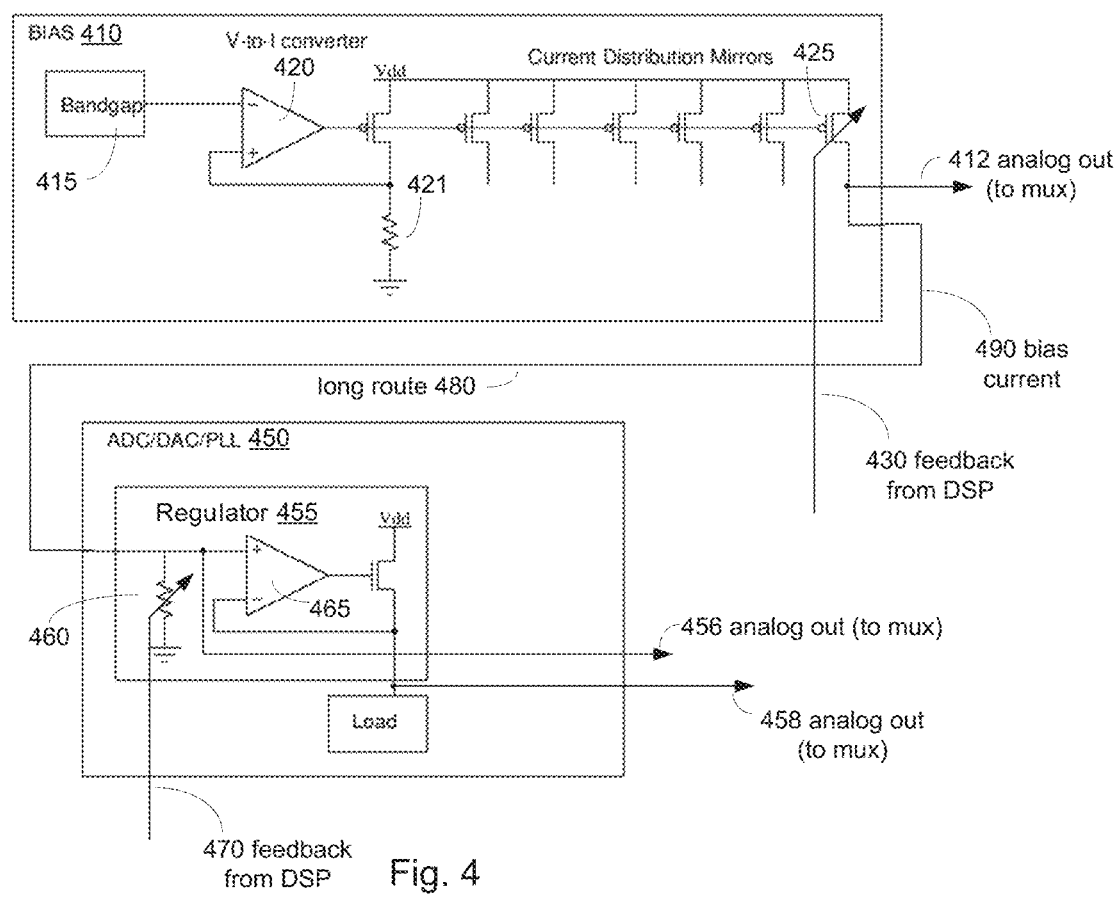
FIG. 4 illustrates schematics of exemplary analog circuits that may be controlled and/or calibrated, in accordance with embodiments of the present invention.

FIG. 4 illustrates schematics of exemplary analog circuits that may be controlled and/or calibrated, in accordance with embodiments of the present invention. Bias generation circuit 410 comprises a bandgap voltage reference 415, a voltage to current converter 420, an on-chip reference resistor 421, and a plurality of current distribution mirror transistors. At least one of the current distribution mirror transistors, transistor(s) 425, may be adjusted by feedback from DSP signal 430. In some embodiments, signal 430 may be generated by digital signal processor 150 and/or finite state machine 160, as illustrated in FIG. 1. Any suitable means for adjusting current distribution mirror transistor(s) 425 may be utilized in accordance with embodiments of the present invention. In one embodiment, a plurality of transistors may be controlled on or off responsive to feedback signal 430 to change a bias current. In one embodiment, a body bias voltage of transistor(s) 425 is adjusted responsive to feedback signal 430. In one embodiment, a digital to analog converter may be used to produce an output current in response to a digital code representing the feedback signal 430.

FIG. 4 also illustrates a portion of an exemplary additional analog circuit 450. Analog circuit 450 may comprise, for example, an analog to digital converter, a digital to analog converter, voltage controlled oscillator, charge pump, clock buffers, and/or a phase locked loop. Analog circuit 450 may comprise a voltage regulator 455. Voltage regulator 455 may comprise an amplifier 465 and a variable resistor 460, controlled by feedback from DSP signal 470. It is to be appreciated that amplifier 465 comprises a plurality of transistors, which are subject to layout, process and environmental variations. In some embodiments, signal 470 may be generated by digital signal processor 150 and/or finite state machine 160, as illustrated in FIG. 1. Feedback signal 470 is operable to change a resistance of variable resistor 460, and thus change one input voltage to the amplifier 465.

In accordance with embodiments of the present invention, bias generator 410 may provide a bias current 490 to analog circuitry 450, for example, through long route 480. As bias current 490 travels through wiring 480, the bias current may degrade due to, for example, resistive, inductive and/or capacitive losses, cross-talk, differing ground references in different parts of an integrated circuit die, and other causes. Further, the performance of both bias generator 410 and analog circuitry 450 is influenced by numerous factors including, for example, physical layout, location on a particular die, location of such a die within a wafer, semiconductor process variations, and environmental factors, including, for example, temperature and supply voltage. Such changes and/or deterioration of bias current 490 may cause undesirable mismatches between different channels of analog circuitry 450 and degrade the performance of individual channels and/or a system as a whole.

In accordance with embodiments of the present invention, one or more nodes of bias generator 410 may be routed, e.g., via multiplexers 114-134 (FIG. 1) to a measurement unit, e.g., measurement unit 140, to be analyzed, e.g., by digital signal processor 150 and/or finite state machine 160. Responsive to the analysis, a feedback signal is generated, e.g., feedback signal 430, to adjust elements of bias generator 410 in order to achieve a desirable or "target" value for the node(s).

Similarly, one or more nodes of analog circuitry 450 may be routed, e.g., via multiplexers 114-134 (FIG. 1), to a measurement unit, e.g., measurement unit 140, to be analyzed, e.g., by digital signal processor 150 and/or finite state machine 160. Responsive to the analysis, a feedback signal is generated, e.g., feedback signal 470, to adjust elements of bias generator 410 in order to achieve a desirable or "target" value for the node(s).

In addition, analog circuitry, e.g., bias generator 410, may be controlled and/or calibrated to minimize power consumption, either at a low level, e.g., of bias generator 410, or at higher levels, e.g., for a functional block, e.g., functional block IP #1 110 (FIG. 1), or a system as a whole. For example, bias generator 410 may be capable of supplying a range of bias currents, e.g., to analog circuitry 450. Embodiments in accordance with the present invention may control bias generator 410 to produce a minimum current required by analog circuitry 450 as received and measured at analog circuitry 450, e.g., subject to detrimental effects of long signal line 480. Advantageously, control bias generator 410 and/or analog circuitry 450 may operate at a minimum power consumption required for proper function.

FIG. 4 further illustrates exemplary analog monitoring signal 412, from bias generator 410, and analog monitoring signals 456, 458, from voltage regulator 455. Signals 412 and 456, while schematically equivalent, are physically different. For example, signal 412 samples signal 490 physically close to, or within, bias generator 410, while signal 456 samples signal 490 physically close to, or within, regulator 455. Such different locations may enable identification of effects of long wire 480, for example. Signals 412, 456, and 458 are coupled to inputs of a multiplexer, e.g., multiplexer 114 (FIG. 1), in order to be measured and utilized in generating feedback control for bias generator 410 and/or regulator 455.

In accordance with embodiments of the present invention, measurements of nodes within bias generator 410 and within analog circuitry 450 may be made by the same measurement unit, e.g., measurement unit 140 (FIG. 1). Such novel use of a single measurement unit enables a system to identify and correct for different behaviors of different circuits due to a variety of factors. Use of a single measurement unit further enables a system to detect and correct for signal degradation between circuits, for example, as previously presented with respect to signal 480.

In this novel manner, a wide variety of analog functions within a plurality of functional blocks may be efficiently and effectively adjusted and/or calibrated to improve performance, including power consumption, of the functional block and/or the system as a whole. Advantageously, the use of a single reference voltage source, e.g., reference generator 220 (FIG. 2), and a single analog to digital converter, e.g., measurement system 200 (FIG. 2), minimizes calibration differences among different circuits due to the use of different references and/or different analog to digital converters. Embodiments in accordance with the preset invention may overcome random and/or systemic mismatches among analog circuitry within an integrated circuit.

In addition, embodiments in accordance with the preset invention may enable electronic circuits to operate at a desirable combination of high performance and low power consumption.

Further, embodiments in accordance with the preset invention may provide systems and methods to assess system operation in a customer environment. Customer environments may often differ from those environments utilized during design, verification, validation, test, and/or manufacturing of an electronic system. Further, a first customer environment may differ from a second customer environment. Embodiments in accordance with the preset invention may enable identification of, and correction for, such differences between a design and/or validation environment and the actual conditions of customer use, thereby improving overall system performance.

Embodiments in accordance with the present invention provide systems and methods for calibration of multi-channel transceivers. In addition, embodiments in accordance with the present invention provide systems and methods for calibration of multi-channel transceivers that utilize a single comparison circuit to measure a plurality of nodes across an integrated circuit. Further, embodiments in accordance with the present invention provide systems and methods for calibration of multi-channel transceivers are needed that improve performance of a system. Still further, embodiments in accordance with the present invention provide systems and methods for calibration of multi-channel transceivers that are compatible and complementary with existing systems and methods of design, test, manufacture, and operation of integrated circuits for use in communication transceivers.

Various embodiments of the invention are thus described. While the present invention has been described in particular embodiments, it should be appreciated that the invention should not be construed as limited by such embodiments, but rather construed according to the below claims.

What is claimed is:

1. A system for calibration of a multi-channel optical transceiver comprising:
    a plurality of voltage regulator circuits, each circuit configured to produce a voltage for circuitry of one channel of said multi-channel optical transceiver;
    an analog multiplexer circuit configured to selectively route said output of one of said plurality of voltage regulator circuits to a single comparison circuit;
    said single comparison circuit configured to compare an output of one of said plurality of voltage regulator circuits to a target voltage value and produce an error signal representing a difference between said output of one of said plurality of voltage regulators and said target voltage value; and
    a processor comprising memory configured to store said target voltage value, and to store a threshold value, said processor configured to accept said error signal and produce a feedback signal for said one of said plurality of voltage regulator circuits, wherein said feedback signal is operable to adjust said voltage to minimize said difference to within said threshold value of said target voltage value;
    circuitry configured to route said feedback signal to more than one of said plurality of voltage regulator circuits, wherein said plurality of voltage regulator circuits, said analog multiplexer circuit, said single comparison circuit and said processor are contained within a single integrated circuit.

2. The system of claim 1 wherein the target voltage value is unique for each of the plurality of voltage regulators.

3. The system of claim 1 wherein the target voltage value is a predetermined target voltage.

4. The system of claim 1 where the target voltage value of one of a polarity of voltage regulators is derived from another on chip measurement.

5. The system of claim 1 configured to produce said feedback signal while said multi-channel optical transceiver is receiving at least one channel of optical communication.

6. The system of claim 1 wherein said error signal is a digital signal.

7. The system of claim 1 wherein said processor comprises a digital signal processor dedicated to generating said feedback signal.

8. The system of claim 1 wherein said processor comprises state machine logic operable to produce said feedback signal independently of executing a stored program.

9. The system of claim 1 wherein said analog multiplexer circuit comprises a plurality of analog switches corresponding to each channel of said multi-channel optical transceiver.

10. The system of claim 6 wherein said analog multiplexer circuit is configured to cascade a voltage output of one of said plurality of voltage regulator circuits corresponding to a first channel of said multi-channel optical transceiver through one of said plurality of analog switches corresponding to a second channel of said multi-channel optical transceiver.

11. The system of claim 1 wherein said single comparison circuit comprises an isolation circuit.

12. A method comprising:
    identifying a target node from among a plurality of nodes within an integrated circuit;
    using a processor operating under software control, configuring an analog multiplexer to couple said target node to a single comparison circuit;
    digitizing an analog value of said target node;
    accessing a target voltage value for said target node from a memory of said processor;
    accessing a threshold value for said target node from a memory of said processor;
    comparing, in a digital domain, said digitized analog value of said target node to said target voltage value;
    in said processor, generating a digital feedback signal to adjust said analog value of said target node toward said target voltage value for said target node; and
    terminating said generating if said digitized analog value of said target node is within said threshold value of said target voltage value for said target node.

13. The method of claim 12 wherein said analog multiplexer is configurable to route the outputs of a plurality of voltage regulators to said single comparison circuit.

14. The method of claim 12 wherein said single comparison circuit comprises an analog to digital converter.

15. The method of claim 12 wherein said target voltage value for said target node is at least partially determined from a measured value of a different node within said integrated circuit.

16. The system of claim 1 wherein said processor operates under software control.

* * * * *